United States Patent [19]
Cho

[11] Patent Number: 6,005,425
[45] Date of Patent: Dec. 21, 1999

[54] PLL USING PULSE WIDTH DETECTION FOR FREQUENCY AND PHASE ERROR CORRECTION

[75] Inventor: James Cho, Plano, Tex.

[73] Assignee: VIA-Cyrix Inc., Richardson, Tex.

[21] Appl. No.: 09/018,639

[22] Filed: Feb. 4, 1998

[51] Int. Cl.[6] .................................................... H03L 7/08
[52] U.S. Cl. .......................... 327/156; 327/159; 331/17; 331/25
[58] Field of Search .................................... 327/155, 156, 327/158, 159; 331/17, 25, 34, 57, 1 A; 375/373, 375, 376

[56] References Cited

U.S. PATENT DOCUMENTS

| | | | |
|---|---|---|---|
| 5,394,444 | 2/1995 | Silvey et al. | 375/374 |
| 5,495,205 | 2/1996 | Parker et al. | 331/1 A |
| 5,870,002 | 2/1999 | Ghaderi et al. | 327/156 |

*Primary Examiner*—Timothy P. Callahan
*Assistant Examiner*—Eunja Adolphe
*Attorney, Agent, or Firm*—Carr & Ferrell LLP

[57] ABSTRACT

A digital PLL in uses pulse width detection to provide frequency/phase error correction for a DCO. A pulse width detector is implemented using fine and coarse detection circuits which provide selectable fine and coarse detection granularity. Both the fine and coarse detection circuits use a number of individual detector elements coupled in sequence—a phase error pulse propagates through the detector elements which quantize pulse width detection. Each detector element includes a pulse width detect latch that latches an phase error pulse width indication for the current cycle and the previous cycle. A comparator determines in each cycle whether the phase error pulse width has changed—a phase correction signal is generated if either (a) the fine detection circuit detects that the phase error pulse width is increasing, or (b) the course detection circuit detects that the phase error is not decreasing.

16 Claims, 7 Drawing Sheets

PLL USING PULSE WIDTH DETECTION FOR FREQUENCY AND PHASE ERROR CORRECTION

BACKGROUND

1. Technical Field

The invention relates generally to integrated circuits using phase locked loop (PLL) circuits, and more particularly relates to frequency and phase error correction mechanisms for PLLs.

In an exemplary embodiment, the invention is used in a digital PLL clock generation circuit that generates the internal clock for a microprocessor.

2. Related Art

Microprocessors commonly employ PLL (phase locked loop) circuits as clock generators that provide an internal clock (which is typically multiplied to provide the CPU core clock) that is synchronized to an external computer system or reference clock. In digital PLLs, a digitally controlled oscillator (DCO) is used to generate the internal clock. Phase error correction circuitry provides control signals to the DCO to maintain synchronization between the generated internal clock and the input reference clock (i.e., correcting deviations in the generated internal clock frequency from the reference clock frequency). The DCO may be either a VCO (voltage controlled oscillator) or ICO (current controlled oscillator), with the frequency error correction circuitry respectively providing either a control voltage or control current. Without limiting the scope of the invention, this background information is provided in the context of a specific problem to which the invention has application: providing a digital PLL with reduced susceptibility to jitter, noise, and process variations.

A variety of phase error correction mechanisms are used to maintain phase lock synchronization with the input reference clock in PLLs. In charge pump PLLs, such as described in the Gardner reference cited at the end of the Background, error correction is made proportional to the magnitude of error pulses that represent phase error. A capacitor is used to provide a VCO control voltage or an ICO control current—the error pulses get translated into a voltage differential at the capacitor (i.e., charge is added to or removed from the capacitor) changing the VCO control voltage and thereby causing the VCO frequency to increase or decrease based on the phase error.

An alternative phase error correction technique is described in the Dunning reference cited at the end of the Background—a control word is used to control the frequency of DCO. The control word is stored in an anchor register. Phase error correction is accomplished by updating the control word in the direction needed to reduce the phase error. When the phase error switches from lead to lag (or vise versa), the control word in the anchor register is updated.

The charge pump technique is problematic in that the frequency gain of the VCO, the size of the resistor(s) and capacitor(s) used in the loop filter, and the amount of charge moved from the capacitor given an error pulse need to be carefully balanced to guarantee good results.

The control word technique is problematic in that it requires a means of finding the correct value to store in the anchor register. Also, in the presence of noise, the cycle to cycle jitter could be large because the control word for the DCO will be changed abruptly to the control word loaded from the anchor register whenever the error changes from lead to lag or vise versa.

A disadvantage of both the charge-pump and the control word error correction techniques is that they are designed to make corrections after every cycle when there is an error present. Two types of errors can be present in a PLL system: a cycle time error and a phase error. The cycle time error refers to the error in the oscillation frequency of the oscillator (i.e., the frequency of the generated internal clock). The phase error refers to the skew between the rising edge of the input reference clock versus the rising edge of the generated internal clock. For a PLL, the only error that can be detected is the phase error. For example, starting from a state with zero phase error, and 100 ps cycle time error, absent error correction, the phase error will accumulate by N*100 ps per reference clock cycle (where N is the ratio of core clock frequency to reference clock frequency). If N=1 (i.e., clock multiplication is not used, and the core clock frequency is the same as the reference clock frequency), the phase error, cycle time error, and what action might be taken for several cycles starting from zero phase error and 100 ps cycle time error are shown in the table below.

| Cycle | Phase Error | Cycle Error | Action Taken |
|---|---|---|---|
| 0 | 0 ps | 100 ps | None. |
| 1 | 100 ps | 100 ps | Oscillator control is adjusted to reduce the cycle time error to 80 ps. |
| 2 | 180 ps | 80 ps | Oscillator control is adjusted to reduce the cycle time error to 50 ps. |
| 3 | 230 ps | 50 ps | Cycle time error is reduced to 0. |
| 4 | 230 ps | 0 ps | C cycle time error is corrected again now it is −50 ps. |
| 5 | 180 ps | −50 ps | Cycle time is adjusted so that CE is −80 ps. |
| 6 | 100 ps | −80 ps | Cycle time is adjusted so that CE is −100 ps. |
| 7 | 0 ps | −100 ps | Charge pump PLL - none. Control word PLL - push in the contents of the anchor register into the DCO control register. |

Note that after 7 cycles, the phase error has been reduced to zero again but the cycle time error is 100 ps. Charge pump PLLs use a resistor between the charge pump and the capacitor—the IR voltage that develops across the resistor acts to temporarily speed up or slow down the DCO and so the phase of the DCO output is nudged without much alteration of the DCO frequency. For the control word PLL, pushing the control word stored in the anchor register into the DCO yields zero cycle time error when the phase error goes from positive to negative or vise versa.

References: (1) Gardner, "Charge-Pump Phase-Lock Loops," IEEE Trans. Commun., vol. COM-28, pp. 1849–1858, November 1980. (2) Dunning et al., "An All-Digital Phase-Locked Loop with 50-Cycle Lock Time Suitable for High-Performance Microprocessors," IEEE Journal Of Solid State Circuits, Vol. 30, No. 4, April 1995.

SUMMARY

An object of the invention is to provide a digital PLL with reduced susceptibility to jitter, noise, and process variations. Another object of the invention is to minimize phase error correction overshoot.

These and other objects of the invention are achieved by an oscillator that generates an oscillator signal synchronized in frequency and phase to a reference signal, and includes phase error correction circuitry that uses pulse width detection for frequency and phase error correction of the oscillator signal. The oscillator, such as a PLL clock generator, can be used in an integrated circuit such as a microprocessor.

In one aspect of the invention, the oscillator includes a phase error detector, and a pulse width detector. The phase error detector generates, in each of successive clock cycles, an error pulse corresponding in width to the magnitude of a phase error between the reference signal and the oscillator signal.

The pulse width detector includes at least one pulse width storage element and a pulse width comparator—in response to the error pulse, the pulse width detector generates a pulse width indication corresponding to the pulse width of the error pulse. The pulse width storage element stores, in a current clock cycle, the pulse width indication for such current cycle—the pulse width indication is stored at least until the next clock cycle. The pulse width comparator compares, in the current clock cycle, the pulse width indication for the current clock cycle with the pulse width indication for a previous clock cycle which is stored in the pulse width storage element—in response to such comparison, the comparator outputs a phase error correction signal for use by the oscillator in correcting the phase error between the reference signal and the oscillator signal.

In an exemplary embodiment, the pulse width detector is implemented using fine and coarse detection circuits which provide selectable fine and coarse detection granularity. Both the fine and coarse detection circuits use a number of individual detector elements coupled in sequence—a phase error pulse propagates through the detector elements which quantize pulse width detection. Each detector element includes a pulse width detect latch that latches an phase error pulse width indication for the current cycle and the previous cycle. A comparator determines in each cycle whether the phase error pulse width has changed—a phase correction signal is generated if either (a) the fine detection circuit detects that the phase error pulse width is increasing, or (b) the course detection circuit detects that the phase error is not decreasing.

Embodiments of the invention may be implemented to realize one or more of the following technical advantages of the invention. The pulse width detection technique of the invention measures and compares from cycle to cycle the width of up and down error pulses from a phase/frequency detector—macro and micro DCO control signals cause a correction in DCO frequency operation only if the phase error is either small but increasing or large and not decreasing. Because the DCO does not receive corrections while the magnitude of the phase error is decreasing, the cycle time error is kept small and overshoot is minimized—achieving zero phase error takes longer that other techniques, but what really matters is maximum phase and cycle time errors (i.e., if the system can survive the maximum errors, recovery time is not critical, but if system failure results because an error is too large, it does not matter how fast zero phase error can be achieved). The pulse width correction technique provides tolerance to process variations, ease of design and analysis, low bandwidth to operating frequency ratio (<0.005) and deterministic error correction. In addition, jitter is minimized by using a decoupling capacitor in the DCO (IOOpF) to filter the supply and substrate noise.

For a more complete understanding of the invention, and for further features and advantages, reference is now made to the Detailed Description of an exemplary embodiment of the invention, together with the accompanying Drawings, it being understood that the invention encompasses any modifications or alternative embodiments that fall within the scope of the claims.

DETAILED DESCRIPTION

The detailed description of an exemplary embodiment of the digital PLL using pulse width detection for frequency/phase error correction, is organized as follows:

1. Digital PLL
1.1. DCO
1.2. Charge Pump With Macro DCO Control
1,3. V/I Converter With Micro DCO Control
2. PWD Control
2.1. Pulse Width Detector
2.2. Fine Detect Circuit
2.3. Coarse Detect Circuit
2.4. Alternative Pulse Width Detector
3. Conclusion This organizational outline, and the corresponding headings, are used in this Detailed Description for convenience of reference only.

The exemplary technique using pulse width detection to provide DCO control is used in digital PLL clock generator for a microprocessor. Detailed descriptions of conventional or known aspects of digital PLL circuits are omitted so as to not obscure the description of the invention.

1. Digital PLL

Figure 1:
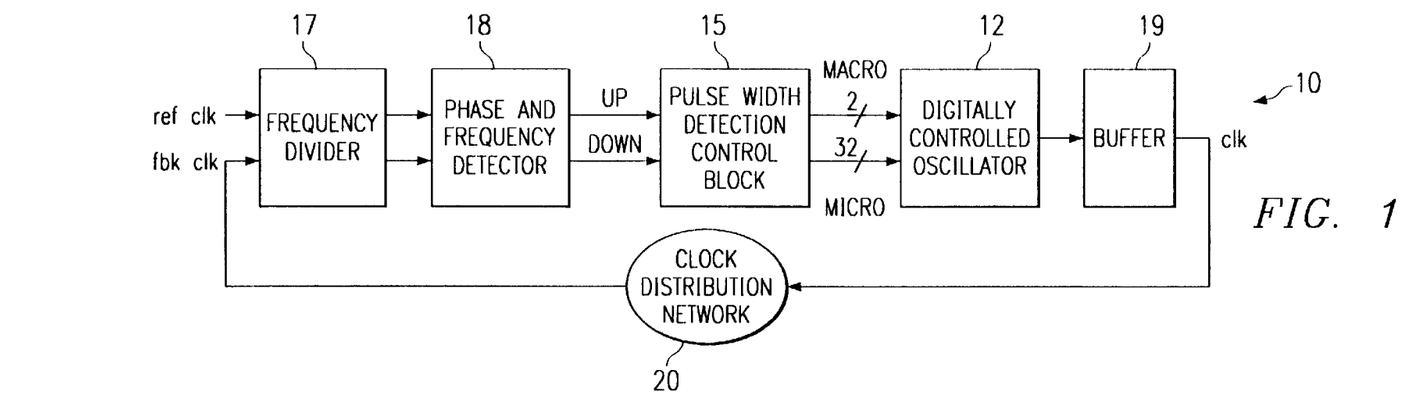
FIG. 1 is a block diagram of an exemplary PLL including a DCO and a PWD (pulse width detection) control block that implements DCO control using pulse width detection for frequency/phase error correction in accordance with aspects of the invention.

FIG. 1 is a block diagram of an exemplary PLL 10 including a DCO 12 and a PWD (pulse width detection) control block 15 that implements DCO control using pulse width detection for frequency/phase error correction in accordance with aspects of the invention.

A conventional frequency divider 17 includes two dividers: (a) a reference clock ref clk divider capable of divide by 1 or 2 and feed back signal fbk clk divider capable of divide by 1 through 8. A conventional phase detector 18 may be implemented with NAND gates—it provides up and dn. pulses whose widths correspond to the magnitude of the phase error between refclk and Fmk clk—in accordance with aspects of the invention, the up/dn. pulses are filtered and converted in the PWD control block into macro and micro DCO control words input to the DCO 12 to correct oscillation frequency and phase of the DCO generated clk.

A buffer 19 amplifies the DCO clk for input to the clock distribution network 20 for a microprocessor (or other integrated circuit). The DCO clk is also fed back through the clock distribution network to the frequency divider 17 as the fbk clk input to the PLL 10.

1.1. DCO

Figure 2A:
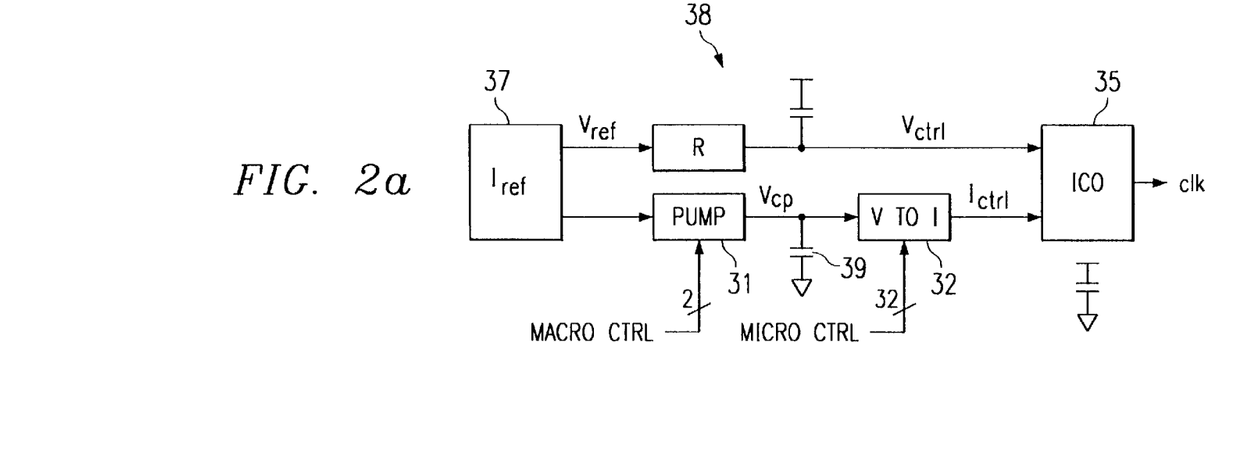
FIG. 2a is a block diagram of an exemplary DCO including a charge pump circuit responsive to a macro DCO control signal from the PWD control block and a V/I converter circuit responsive to a micro DCO control from the PWD control block.

FIG. 2a is a block diagram of an exemplary DCO 12 including a charge pump 31 and a V/I converter 32 responsive respectively to macro and micro DCO control words from the PWD control block (15 in FIG. 1) in accordance with aspects of the invention.

An ICO (current controlled oscillator) 35 provides the generated clk output of the DCO. ICO 35 is of conventional design in which the oscillation frequency and phase are determined by a control voltage Vctrl and a control current Ictrl.

A voltage/current reference circuit VIref 37 generates a reference voltage Vref and a reference current Iref.

Vref is generated conventionally by the VIref circuit 37, such as by forcing fixed amount of current through series of two diode connected PMOS devices (not shown). Vref is filtered using a large RC 38 to provide a stable ICO control voltage Vctrl relative to VDD.

Iref is also generated conventionally by VIref circuit 37, such as by use of a band gap reference circuit. Iref is input to the charge pump 31 to provide a charge/discharge current that adjusts an output capacitor voltage Vcp—Vcp is then converted by the V/I converter 32 into the ICO control current Ictrl.

1.2. Charge Pump With Macro DCO Control

Figure 2B:
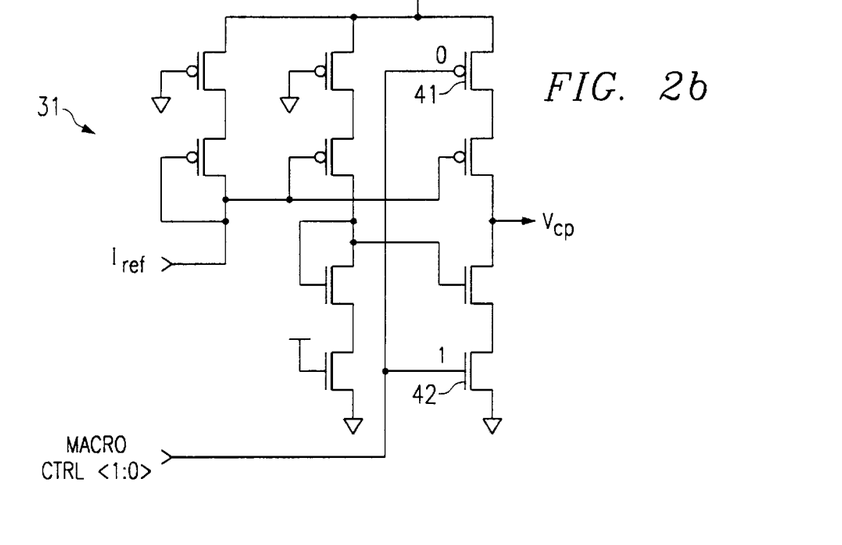
FIGS. 2b and 2c illustrate respectively (a) an exemplary charge pump circuit, and (b) an exemplary V/I converter circuit.

FIG. 2b illustrates an exemplary charge pump 31 coupled to charge/discharge an output capacitor 39. In accordance with aspects of the invention, charge pump 31 converts the input Iref into a charge/discharge current that adjusts the capacitor voltage Vcp in response to the macro DCO control word generated by the PWD control block (15 in FIG. 1).

Charge pump 31 is configured as a conventional current mirror circuit in which the two bit macro control word is used to determine whether the charge pump charges or discharges the output capacitor 39 to correspondingly increasing or decreasing the capacitor voltage Vcp. If the macro control word selects transistor 41, the charge pump charges the output capacitor to increase Vcp. If the macro control word selects transistor 42, the charge pump discharges the output capacitor to decrease Vcp. If the macro control word switches both transistors off, the charge pump is put in a high impedance state.

Capacitor 39 is chosen to minimize fluctuation due to VDD/GND bounce or change in the content of the macro control word.

1.3. V/I Converter With Micro DCO Control

Figure 2C:
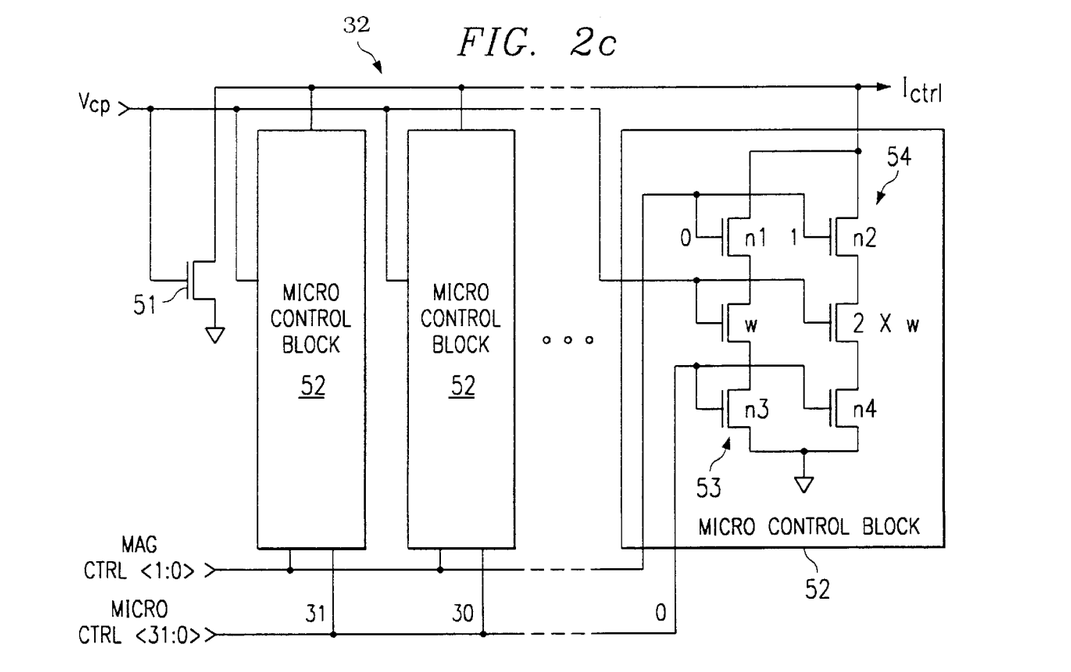

FIG. 2c illustrates an exemplary V/I converter 32 that converts the input Vcp voltage into the ICO control current Ictrl. The V/I converter includes a large NMOS device 51 and 32 identical micro control blocks 52. Each micro control block is controlled by an corresponding micro DCO control word bit, and a two bit magnitude control word—together, the micro control blocks control the magnitude of the ICO control current Ictrl.

Each micro control block 52 includes two transistor stacks 53 and 54, with the transistors in stack 54 being configured to be twice as strong as the transistors in stack 53. The magnitude control word selects the strength of each micro control block by enabling either stack 53 or 54, or both. For the exemplary embodiment, the value of the magnitude control word is statically selectable, such as by a bond out option (although the magnitude control word could be made programmable).

Each of the 32 microcontrol blocks receives (in addition to the magnitude control word) the input voltage Vcp and a corresponding bit of the micro control word. Vcp controls the magnitude of the current through the current stack(s) enabled by the magnitude control word. The micro control bit is used to enable a given microcontrol block, with the number of blocks enabled determining the value of the ICO control current Ictrl.

2. PWD Control

Figure 3A:
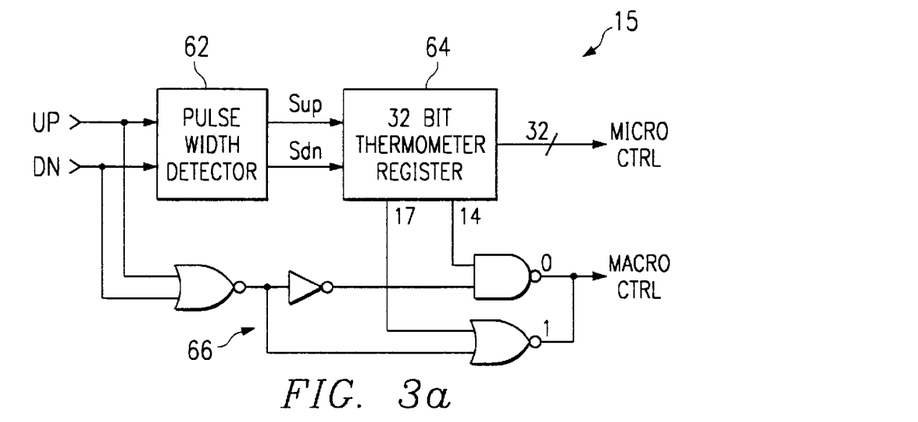
FIG. 3a is a block diagram of an exemplary PWD control block including a pulse width detector.

FIG. 3a is a block diagram of an exemplary PWD control block 15 including a pulse width detector 62, a 32 bit thermometer register 64, and a macro control network 66. The PWD control block generates the micro and macro DCO control words in accordance with aspects of the invention.

The pulse width detector 62 receives up/dn. signals from the phase and frequency detector (18 in FIG. 1)—the input up/dn. signals are translated by the pulse width detector into shift up and shift down Sup/Sdn signals supplied to the thermometer register 64.

The 32 bit thermometer register 64 is conventionally implemented as a shift register with a series of 0s followed by a series of 1s. When the PLL is first activated, the contents of the thermometer register are set to 16 0s followed by 16 1s.

For the exemplary embodiment, logic circuit 66 is used to generate the macro control word. If bit 17 of the thermometer register becomes 0, the macro control word bit 1 will pulse high whenever up/dn. pulses high. If bit 14 of the thermometer register becomes 1, the macro control word bit 0 will pulse low whenever up/dn. pulses high.

2.1. Pulse Width Detector

Figure 3B:
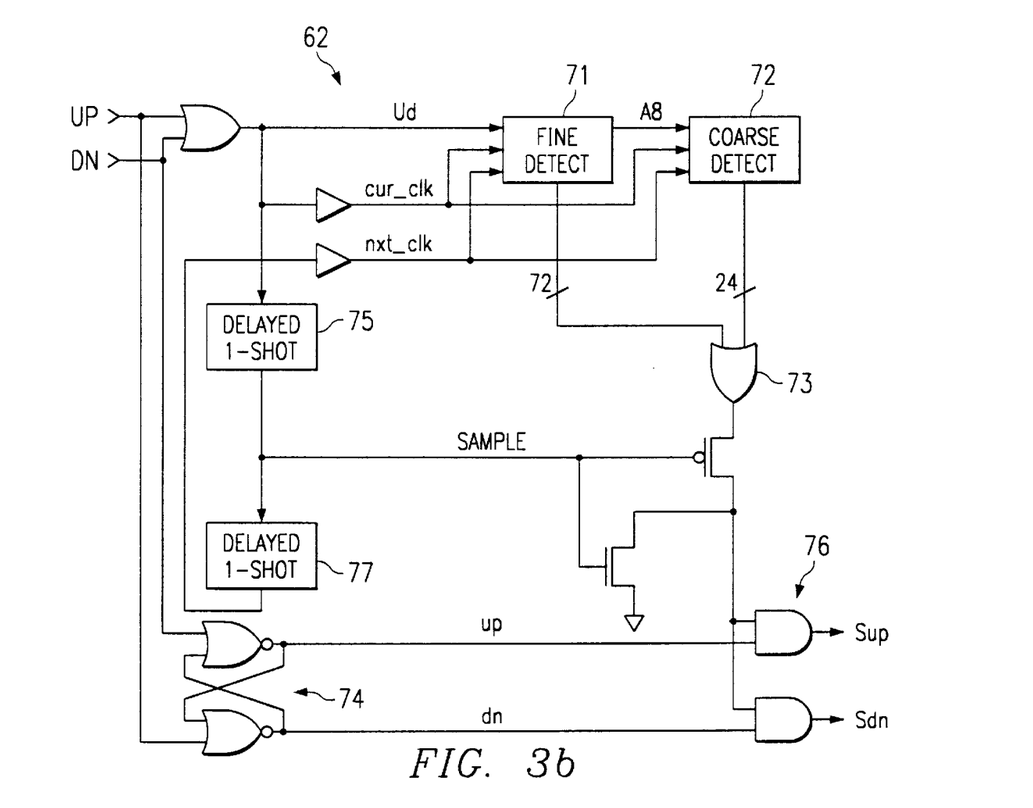
FIG. 3b illustrates an exemplary pulse width detector including a fine detect circuit and a coarse detect circuit.

FIG. 3b illustrates an exemplary pulse width detector 62 including a fine detect circuit 71 and a coarse detect circuit 72. The up/dn. pulses input to the pulse width detector 62 are ORed to form a single pulse ud that is input to the fine detect circuit 71—the width of the ud pulse corresponds to the phase error between the input ref clk and the DCO generated clk as represented by the Fbk clk (see. FIG. 1).

The fine detect and coarse detect circuits 71 and 72 receive two clock signals: cur_clk and nxt_clk. The cur_clk signal is generated by amplifying the ud pulse, and is used to capture the width of the current ud pulse in the fine and coarse detect blocks for use during the current cycle in detecting a change in pulse Width by comparison with the pulse width for the previous cycle. The nxt_clk signal is used to capture the width of the current ud pulse in the fine and coarse detect blocks for use during the next cycle in detecting a change in pulse width by comparison with the current pulse width for that cycle.

The fine detect and coarse detect circuits 71 and 72 determine if the ud pulse in a current cycle is wider than the ud pulse from the previous cycle. If the current cycle ud pulse is wider, one or more of the 71 outputs of the fine detect circuit or one or more of the 24 outputs of coarse detect circuit 72 will go high. The 74 bit fine detect circuit output and the 24 bit coarse detect circuit output are input to an OR gate 73 which provides a logic 1 phase error correction output if the pulse width in the current cycle is larger than or equal to the pulse width from the previous cycle (within the ranges provided by the fine/coarse detect circuits).

A latch 74 captures the type of phase error (i.e., leading or lagging) received by latching the up/dn. signals input to the pulse width detector 62 in the current cycle.

The falling edge of ud causes a delayed one-shot 75 to generate a negative sample pulse after sufficient time has passed for the output of OR gate 73 to stabilize.

If the output of OR gate 73 is high, the sample pulse from one-shot 75 causes an output NAND gate network 76 to generate either Sup or Sdn depending on which of the latched up/dn. values is high. Sup/Sdn are the output of the pulse width detector 62 which is provided to the thermometer register 64, causing it to appropriately shift up or down, thereby controlling the values of the macro and micro DCO control words.

If output of OR gate 73 is low, indicating that the current ud pulse width was smaller, the Sup/Sdn pulses are not generated. As a result, the thermometer register 64 does not shift in value, and the micro DCO control word does not change.

The rising edge of the sample signal from delayed one-shot 75 causes the second delayed one-shot 77 to generate the nxt_clk input to the fine detect and coarse detect circuits 71 and 72 to store the quantized width of the current ud pulse for use during the next cycle.

2.2. Fine Detect Circuit

Figure 3C:
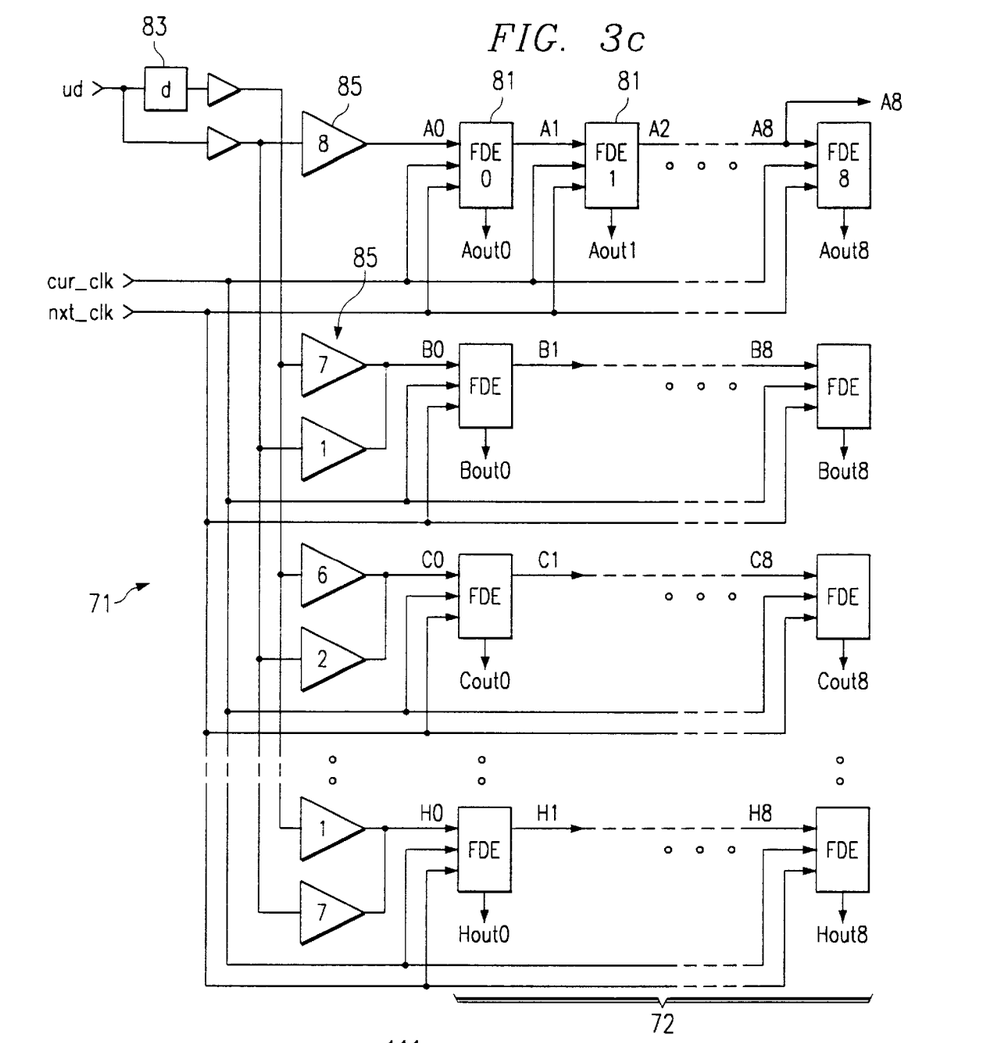
FIGS. 3c and 3d illustrate respectively (a) an exemplary fine detect circuit including fine detect elements, and (b) an exemplary coarse detect circuit including coarse detect elements.

FIG. 3c illustrates an exemplary fine detect circuit 71 including 72 identical fine detect elements FDE 81, each providing a one bit fine detect output corresponding to the 72 bit output from the fine detect circuit 71 (which is input to OR gate 73 in FIG. 3b).

To obtain "fine" pulse width detection granularity, the 72 FDEs are arranged in a grid of 8 rows A–H of 9 elements [0–8] each. The ud pulse is input to each row of FDEs through two paths: (a) one through a delay element 83 (for example, an inverter chain), and (b) one that is not delayed. The delayed and non-delayed ud pulses input to each row are offset by the delay caused by the delay element 83. The skew between signals (A0, B0, . . . H0) entering each row is approximately ⅛ of delay caused by delay element 83. This is achieved by inputting the delayed and non-delayed ud pulses to the FDE rows through a combination of differently sized amplifiers 85. In each FDE row, the granularity of detection is the delay caused by the delay element 83, but for the entire fine detect circuit 71 the granularity is ⅛ the delay caused by the delay element 83.

The delayed ud pulse is input to the first FDE [0] of each of rows B–H through differently sized amplifiers 85 (i.e., the delayed ud pulse is not input to FDE [0] in row A). The non-delayed ud pulse is input to the first FDE [0] of each of the rows A–H. through differently sized amplifiers 85. Thus, the first FDE [0] of the rows B–H receives at the same input both the delayed and non-delayed ud pulse.

Each FDE also receives both the cur_clk and nxt_clk (see, Section 2.1 and FIG. 3a). In accordance with aspects of the invention, these clock signals are used in each cycle to store into each FDE signals representative of the pulse width for the current cycle and the previous cycle, allowing comparison to determine if pulse width is changing cycle to cycle.

In each FDE row, the first FDE [0] provides a propagation signal input to the next FDE [1], which provides a propagation signal input to the next FDE [2], and so on—for this first row, FDE [7] provides a propagation signal input both to the next FDE [8], and to the coarse detect circuit 72 (see, Section 2.3).

Figure 3D:
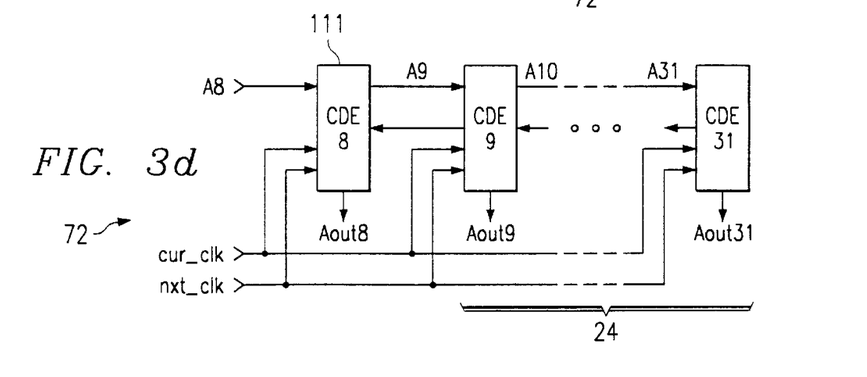
Figure 3E:
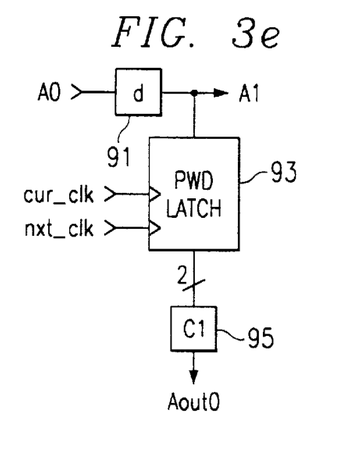
FIGS. 3e and 3f illustrate respectively (a) an exemplary fine detect element, and (b) an exemplary coarse detect element.

FIG. 3e provides detail for each FDE 81, which includes a delay element 91, a PWD latch (storage element) 93, and an FDE comparator 95. In particular, for the first FDE [0] of row A, the input A0 is fed through delay element 91 to provide a delay signal A1 for input both to the next FDE [1], and to the PWD latch 93. In addition, FDE [0] provides a fine detect output bit Aout0.

Figure 3F:
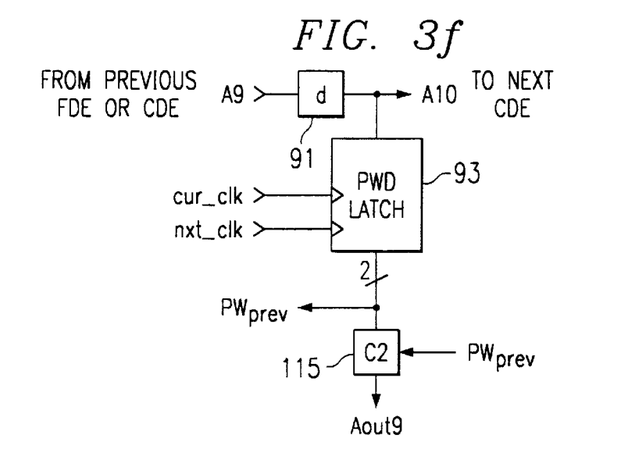
Figure 3G:
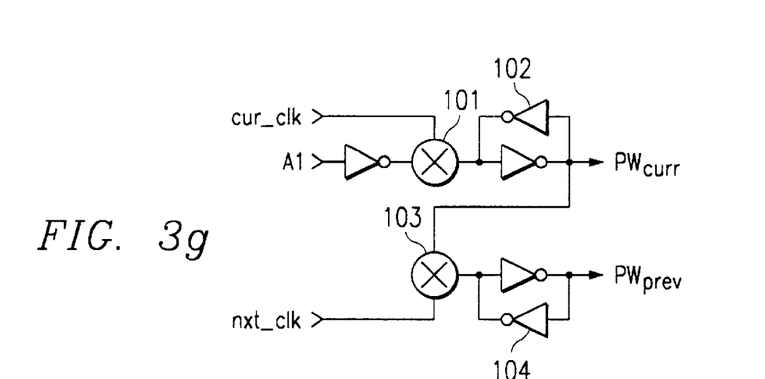
FIGS. 3g–3i illustrate respectively (a) an exemplary PWD latch used in the fine and coarse detect elements, (b) a fine detect element comparator, and (c) a coarse detect element comparator.

FIG. 3g illustrates an exemplary PWD latch 93. A transmission gate 101 driven by the cur_clk signal remains transparent while cur_clk is high—if cur_clk remains high long enough for the input signal (for example, A0 in FIG. 3e) to propagate through the delay element 91, then the FDE output (for example, A1 in FIG. 3e) will be latched by a cur_latch 102 as a logic 1. However, if cur_clk deasserts so that transmission gate 101 becomes opaque before the input signal reaches the PWD latch 93, the output stored on cur_latch 102 will be a logic 0.

Sometime after cur_clk asserts, nxt_clk will assert (see, Section 2.1 in connection with FIG. 3b and delayed one-shot 77), opening transmission gate 103 and latching an inverted version of the logic level stored in cur_latch 102 into nxt_latch 104. Thus, for a given current cycle, during the time after cur_clk asserts and before nxt_clk asserts, the latch PWD 93 stores a pulse width value PWcur latched in the current cycle in the cur_latch 102, and a pulse width value PWprv for the previous cycle still latched into the nxt_latch 104 (i.e., until nxt_clk asserts to latch the pulse width value for the current cycle into the nxt_latch).

Referring also to FIG. 3e, the latched pulse width values PWcur and PWprv form a two bit output from the PWD latch 93 which is input to the FDE comparator 95.

Figure 3H:
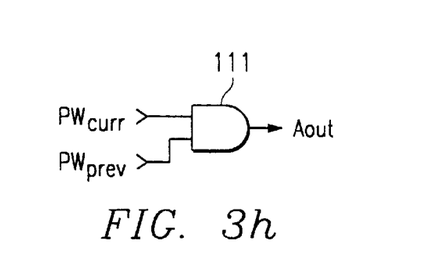

FIG. 3h illustrates the FDE comparator 95 as a AND gate 111, that receives the PWcur and PWprv output from the PWD latch (93 in FIG. 3e), and provides the fine detect bit output Aout0. Note that the output of an FDE-type comparator will transition high only if the pulse width for the current cycle is wider than the pulse width for the previous cycle—that is, both PWcurr and PWprev are asserted, PWprev being the inverted version of PWcurr for the previous cycle. Thus, fine detection will cause a correction only if the phase error is increasing (in contrast to coarse detection which will force a correction if the phase error is not getting smaller)

Note that the configuration of the fine detect circuit 71 to achieve a 72 bit degree of pulse width detection granularity is a matter of design choice—a larger or smaller number of FDFs could be used.

2.3. Coarse Detect Circuit

FIG. 3d illustrates an exemplary coarse detect circuit 72 including 24 coarse detect elements CDE 111, each providing a one bit coarse detect output corresponding to the 24 bit output from the coarse detect circuit 72 (which is input to OR gate 73 in FIG. 3b).

To obtain "coarse" pulse width detection granularity, the 24 CDEs [8–32] are arranged in a single row. The input A8 to the first CDE [8] is the output of the fine detect element FDE [7] in the first FDE row of the fine detect circuit (see, Section 2.2 and FIG. 3c).

Each CDE also receives both the cur_clk and nxt_clk (see, Section 2.1 and FIG. 3a). In accordance with aspects of the invention, these clock signals are used in each cycle to store into each CDE signals representative of the pulse width for the current cycle and the previous cycle, allowing comparison to determine if pulse width is changing cycle to cycle.

FIG. 3f provides detail for each CDE 111, which is basically the same as the FDE element (FIG. 3e) in that it includes the same delay element 91 and a PWD latch (storage element) 93, but with a CDE comparator 115 that is different than the FDE comparator (95 in FIG. 3e). In particular, for the first CDE [8], the input A8 is fed through delay element 91 to provide a delay signal A9 for input both to the next CDE [9], and to the PWD latch 93. In addition, CDE [8] provides a coarse detect output bit Aout8.

Referring to FIG. 3g, the exemplary PWD latch 93 is illustrated—its operation in a CDE is identical to its operation in an FDE (see, Section 2.2). In particular, for a given current cycle, during the time after cur_clk asserts and before nxt_clk asserts, the latch PWD 93 stores a pulse width value PWcur latched in the current cycle in the cur_latch 102, and a pulse width value PWprv for the previous cycle still latched into the nxt_latch 104 (i.e., until nxt_clk asserts to latch the pulse width value for the current cycle into the nxt_latch).

Referring also to FIG. 3f, the latched pulse width values PWcur and PWprv form a two bit output from the PWD latch 93 which is input to the CDE comparator 115. In addition, for CDEs [8–31], the pulse width value PWprev is fed back to the CDE comparator in the previous CDE.

Figure 3I:
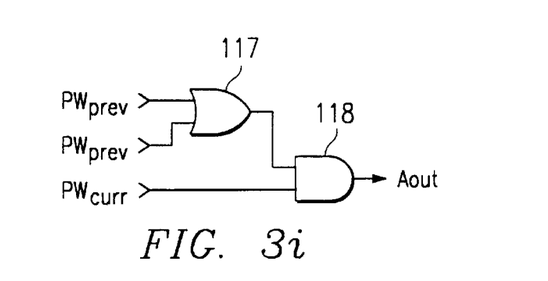

FIG. 3i illustrates the CDE comparator 115 as formed by OR/AND gates 117/118. NOR gate 117 receives the PWprv output from (a) the PWD latch in its CDE, and (b) the PWD latch in the next CDE. AND gate 118 receives the output of OR gate 117 and the PWcurr output from the PWD latch in its CDE, and provides the coarse detect bit output Aout8. Note that the output of a CDE-type comparator will transition high if the phase error pulse width for the current cycle is not less than the phase error pulse width for the previous cycle. Thus, coarse detection will force a correction if the phase error is not decreasing (in contrast to fine detection which will cause a correction if the phase error only if the phase error is increasing).

Note that the configuration of the coarse detect circuit 72 to achieve a 24 bit degree of pulse width detection granularity is a matter of design choice—a larger or smaller number of CDEs could be used. Also, near the end of the detection chain, more than one delay element between PWD latches may be used to maintain a lower latch and comparator count while obtaining the ability to detect wider pulse widths (with an attendant increase in detection granularity).

2.4. Alternative Pulse Width Detector

Figure 4A:
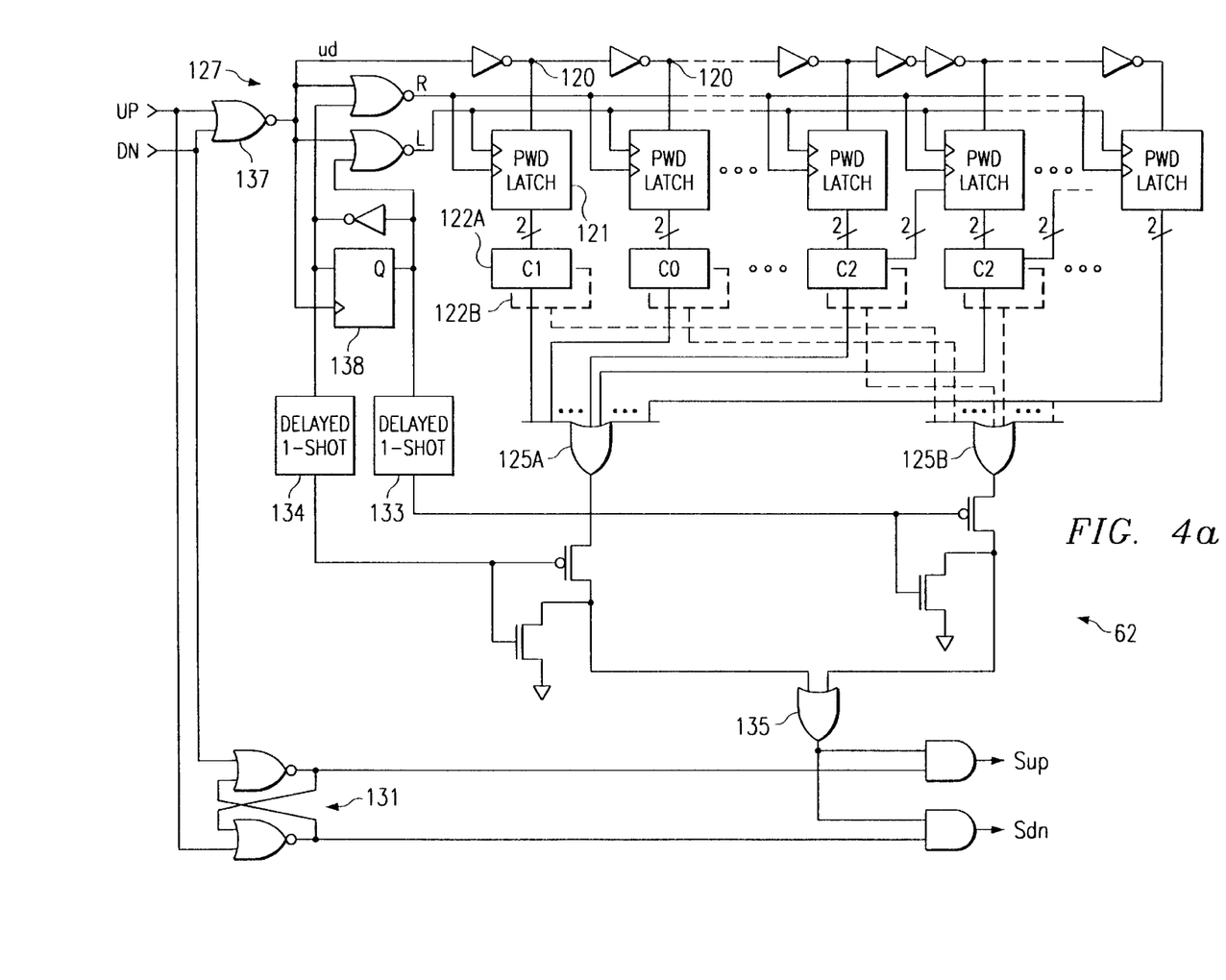
FIGS. 4a–4e illustrate respectively (a) an alternative embodiment of the pulse width detector (FIG. 4a), and (b) PWD latch and comparator circuits used in the alternative pulse width detector (FIGS. 4b–4e).
Figure 4B:
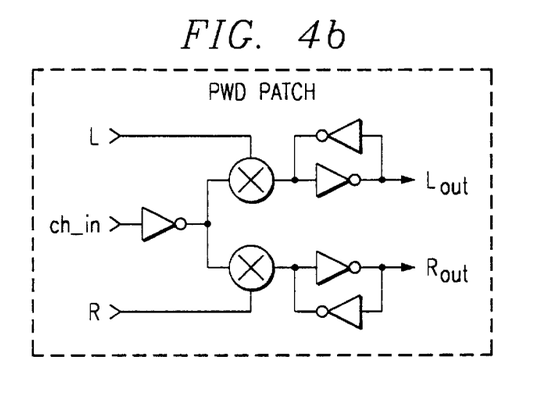

FIG. 4a illustrates an alternative embodiment of the pulse width detector (62 in FIG. 4a). The alternative pulse width detector includes a sequence of pulse width detector elements 120, each with (a) a PWD latch 121 (as shown in FIG. 4g), and (b) left and right comparators 122A and 122B. For each detector element 120, the left and right comparators 122A and 122B provide pulse width comparison outputs respectively to left and right OR gates 125A and 125B.

An inverter chain 127 propagates the ud error pulse to the successive detector elements. A latch 131 detects the type of error pulse ud received (i.e., leading or lagging). The delayed one-shot circuits 133 and 134 are used to sample the output of the OR gates 125A and 125B after the error pulses dissipate and the comparison circuits settle. The OR gates 125A and 125B assert respective phase error correction outputs if any of the pulse width detection bits from comparators 122A and 122B are asserted—the two phase error correction outputs are ORed 135 together to form a single phase error correction pulse.

The ud correction pulse from OR gate 137 performs three functions: (a) clock a toggle flip flop 138 whose output triggers the delayed one-shots and controls which of the left/right comparators is used and which side of the PWD latches sample the inverter chain, (b) clock the PWD latches, and (c) drive the inverter chain. The PWD latch samples the inverter chain and stores the result whenever L or R is high.

Thus, each time an error pulse ud arrives, it's width is compared to the width of the previous error pulse. The C0, C1, and C2 comparators compare the values stored on the left and right sides of the PWD latches. If the left side is being evaluated, C1 will put out a high signal if Lout is high and Rout is low. C0 output goes high if the side being evaluated is low and the other side is high. C2, which evaluate the contents of PWD latched tied to middle to end of the inverter chain, will put out a low signal only if the error pulse is deemed to be shorter than the previous error pulse. If the error pulse is wide enough to cause the last inverter in the chain to change before the latch becomes opaque, the Sup/Sdn shift signal are asserted.

Figure 4C:
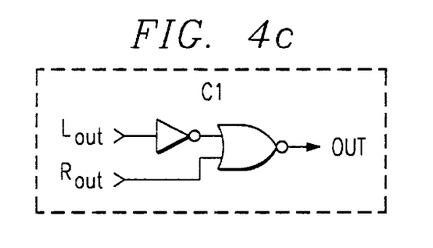
Figure 4D:
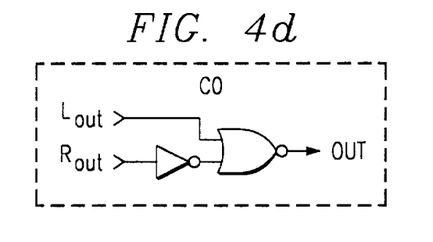
Figure 4E:
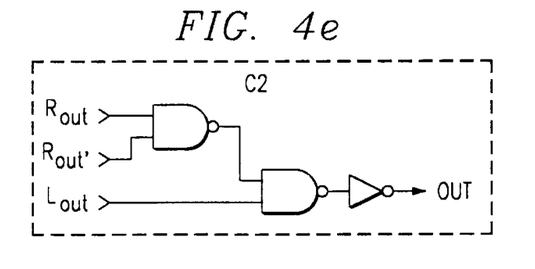

FIGS. 4b–4e illustrate respectively (a) the PWD latch (FIG. 4b), and (b) the C1, C0, and C2 comparators used in the alternative pulse width detector (FIGS. 4c–4e).

The advantage provided by the alternate embodiment of the pulse width detector is the reduction in clocking complexity (i.e., the need to generate nxt_clk using two delayed one-shots in series). The disadvantage is that two copies of the comparator circuits are required.

3. Conclusion

Although the Detailed Description of the invention has been directed to certain exemplary embodiments, various modifications of these embodiments, as well as alternative embodiments, will be suggested to those skilled in the art.

Logic is generally used in the hardware sense, recognizing that implementations involving microcode or other software routines would be equivalent. Moreover, various modifications based on trade-offs between hardware and software logic will be apparent to those skilled in the art.

Also, references to dividing data into bytes, words, double words (dwords), quad words (qwords), etc., when used in the claims, are not intended to be limiting as to the size, but rather, are intended to serve as generic terms for blocks of data.

The invention encompasses any modifications or alternative embodiments that fall within the scope of the claims.

I claim:

1. An integrated circuit including an oscillator that generates an oscillator signal synchronized in frequency and phase to a reference signal, and including phase error correction circuitry using pulse width detection for frequency and phase error correction of the oscillator signal, comprising:

(a) a phase error detector that in each of successive clock cycles generates, in response to the reference signal and the oscillator signal, an error pulse corresponding in width to the magnitude of a phase error between the reference signal and the oscillator signal in the corresponding clock cycle; and (b) a pulse width detector coupled to receive the error pulse, including at least one pulse width storage element and a pulse width comparator, the pulse width detector being operable to generate in response to the error pulse a pulse width indication corresponding to the pulse width of the error pulse;

(c) the pulse width storage element being operable to store, in a current clock cycle, the pulse width indication for such current cycle, which pulse width indication is stored at least until the next clock cycle; and (d) the pulse width comparator being operable to compare, in the current clock cycle, the pulse width indication for the current clock cycle with the pulse width indication for a previous clock cycle which is stored in the pulse width storage element, and in response to such comparison to output a phase error correction signal for use by the oscillator in correcting the phase error between the reference signal and the oscillator signal.

2. The integrated circuit of claim 1, wherein the oscillator and the phase error correction circuitry comprises a phase lock loop (PLL) clock generator.

3. The integrated circuit of claim 1, wherein the pulse width detector comprises:

(a) a fine detect circuit that detects cycle to cycle pulse width differences with a predetermined fine granularity; and (b) a coarse detect circuit that detects cycle to cycle pulse width differences with a predetermined coarse granularity that is greater than the fine granularity;

(c) wherein each of the fine detect circuit and the coarse detect circuit comprises the pulse width storage element and the pulse width comparator.

4. The integrated circuit of claim 3, wherein the pulse width detector outputs the phase error correction signal (i) if the fine detect circuit detects that the phase error is increasing, or (ii) if the coarse detect circuit detects that the phase error is not decreasing.

5. The integrated circuit of claim 1, wherein the pulse width detector comprises:

(a) a plurality of pulse width detector elements coupled in sequence such that, in each of successive clock cycles generates, the error pulse from the phase error detector is input to a first detector element and propagates through such detector element and then through successive detector elements; and (b) wherein, in each clock cycle, the pulse width indication corresponds to the number of detector elements through which the error pulse propagates.

6. The integrated circuit of claim 1, wherein the pulse width detector outputs the phase error correction signal only if the pulse width difference is not getting smaller.

7. An integrated circuit including an oscillator that generates an oscillator signal synchronized in frequency and phase to a reference signal, and including phase error correction circuitry using pulse width detection for frequency and phase error correction of the oscillator signal, comprising:

(a) phase error detection means for generating, in each of successive clock cycles, in response to the reference signal and the oscillator signal, an error pulse corresponding in width to the magnitude of a phase error between the reference signal and the oscillator signal in the corresponding clock cycle; and (b) pulse width detection means for generating, in response to the error pulse, a pulse width indication corresponding to the pulse width of the error pulse;

(c) pulse width storage means for storing, in a current clock cycle, the pulse width indication for such current cycle, which pulse width indication is stored at least until the next clock cycle; and (d) pulse width comparator means for comparing, in the current clock cycle, the pulse width indication for the current clock cycle with the pulse width indication for a previous clock cycle which is stored in the pulse width storage means, and in response to such comparison to output a phase error correction signal for use by the oscillator in correcting the phase error between the reference signal and the oscillator signal.

8. The integrated circuit of claim 7, wherein the oscillator and the phase error correction circuitry comprises a phase lock loop (PLL) clock generator.

9. The integrated circuit of claim 7, further comprising:

(a) fine detect means for detecting cycle to cycle pulse width differences with a predetermined fine granularity; and (b) coarse detect means for detecting cycle to cycle pulse width differences with a predetermined coarse granularity that is greater than the fine granularity;

(c) wherein each of the fine detect means and the coarse detect means comprises the pulse width storage means and the pulse width comparator means.

10. The integrated circuit of claim 9, wherein the pulse width comparator means outputs the phase error correction signal (i) if the fine detection means detects that the phase error is increasing, or (ii) if the coarse detection means detects that the phase error is not decreasing.

11. The integrated circuit of claim 7:

(a) wherein the pulse width detection means comprises a plurality of pulse width detector elements coupled in sequence such that, in each of successive clock cycles generates, the error pulse from the phase error detector is input to a first detector element and propagates through such detector element and then through successive detector elements; and (b) wherein, in each clock cycle, the pulse width indication corresponds to the number of detector elements through which the error pulse propagates.

12. The integrated circuit of claim 7, wherein the pulse width comparator means outputs the phase error correction signal only if the pulse width difference is not getting smaller.

13. A method of phase error correction using pulse width detection, for use with an oscillator that generates an oscillator signal synchronized in frequency and phase to a reference signal, comprising the steps:

(a) generating, in each of successive clock cycles, in response to the reference signal and the oscillator signal, an error pulse corresponding in width to the magnitude of a phase error between the reference signal and the oscillator signal in the corresponding clock cycle; and (b) generating, in response to the error pulse, a pulse width indication corresponding to the pulse width of the error pulse;

(c) storing, in a current clock cycle, the pulse width indication for such current cycle, which pulse width indication is stored at least until the next clock cycle; and (d) comparing, in the current clock cycle, the pulse width indication for the current clock cycle with the pulse width indication stored for a previous clock cycle, and (e) in response to such comparison, outputting a phase error correction signal for use by the oscillator in correcting the phase error between the reference signal and the oscillator signal.

14. The method of phase error correction using pulse width detection of claim 13, further comprising the steps of:

(a) detecting cycle to cycle pulse width differences with a predetermined fine granularity; or (b) detecting cycle to cycle pulse width differences with a predetermined coarse granularity that is greater than the fine granularity;

(c) wherein each detecting step comprises the steps of storing and comparing.

15. The method of phase error correction using pulse width detection of claim 14, wherein the step of outputting a phase error correction signal comprises the steps: outputting a phase error correction signal (i) if the step of detecting cycle, to cycle pulse width difference with a predetermined fine granularity indicates that the phase error is increasing, or (ii) if the step of detecting cycle to cycle pulse width differences with a predetermined coarse granularity indicates that the phase error is not decreasing.

16. The method of phase error correction using pulse width detection of claim 13, wherein the phase error correction signal is output only if the pulse width difference is not getting smaller.

* * * * *